US012727354B2

(12) United States Patent
Deng et al.

(10) Patent No.: US 12,727,354 B2
(45) Date of Patent: Sep. 1, 2026

(54) DISPLAY APPARATUS, DISPLAY PANEL AND MANUFACTURING METHOD THEREOF

(71) Applicants: Chengdu BOE Optoelectronics Technology Co., Ltd., Chengdu (CN); BOE Technology Group Co., Ltd., Beijing (CN)

(72) Inventors: Lei Deng, Beijing (CN); Yue Wei, Beijing (CN); Yanxin Su, Beijing (CN); Minghui Li, Beijing (CN); Xu Yang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 423 days.

(21) Appl. No.: 18/289,228

(22) PCT Filed: Apr. 25, 2022

(86) PCT No.: PCT/CN2022/089088
§ 371 (c)(1),
(2) Date: Nov. 2, 2023

(87) PCT Pub. No.: WO2023/206025
PCT Pub. Date: Nov. 2, 2023

(65) Prior Publication Data
US 2024/0251622 A1 Jul. 25, 2024

(51) Int. Cl.
*H10K 59/131* (2023.01)
*H10K 59/12* (2023.01)
(Continued)

(52) U.S. Cl.
CPC ..... *H10K 59/1315* (2023.02); *H10K 59/1201* (2023.02); *H10K 59/1213* (2023.02); *H10K 59/1216* (2023.02); *H10K 59/126* (2023.02)

(58) Field of Classification Search
CPC ........... H10K 59/1315; H10K 59/1201; H10K 59/1213; H10K 59/1216; H10K 59/126; H10K 59/12; H10K 59/131; H10D 86/00
See application file for complete search history.

(56) References Cited

FOREIGN PATENT DOCUMENTS

| | | | |
|---|---|---|---|
| CN | 111063692 | A | 4/2020 |
| CN | 113675247 | A | 11/2021 |

(Continued)

OTHER PUBLICATIONS

International Search Report and Written Opinion mailed on Jan. 11, 2023, in corresponding PCT/CN2022/089088, 8 pages.

*Primary Examiner* — Fernando L Toledo
*Assistant Examiner* — Shawn Shaw Muslim
(74) *Attorney, Agent, or Firm* — XSENSUS LLP

(57) ABSTRACT

A display apparatus, a display panel, and a manufacturing method thereof, relate to the field of display technology. The display panel includes a substrate, a transistor layer, a wiring layer, a flat layer, and a light emitting layer. The transistor layer is disposed on a side of the substrate and includes a storage capacitor and a transistor. The material of the first type of transistor includes silicon, and material of the second type of transistor includes a metal oxide. The wiring layer is disposed on a side of the transistor layer away from the substrate and connected to the transistor layer to form a plurality of pixel circuits. The wiring layer includes a data line and a first power supply line. The flat layer covers the wiring layer. The light emitting layer is disposed on the flat layer.

20 Claims, 10 Drawing Sheets

(51) Int. Cl.
*H10K 59/121* (2023.01)
*H10K 59/126* (2023.01)

(56) References Cited

FOREIGN PATENT DOCUMENTS

| | | | | | |
|---|---|---|---|---|---|
| CN | 114005857 | A | * | 2/2022 | ......... H10K 59/1213 |
| CN | 114175257 | A | | 3/2022 | |
| WO | 2022/170661 | A1 | | 8/2022 | |

* cited by examiner

GA1

DISPLAY APPARATUS, DISPLAY PANEL AND MANUFACTURING METHOD THEREOF

The present disclosure is a U.S. National Stage of International Application No. PCT/CN2022/089088, filed on Apr. 25, 2022, which relates to the field of display technology and, specifically, to a display apparatus, a display panel, and a method of manufacturing the display panel.

TECHNICAL FIELD

Background

Display panels are not only used in cell phones, computers, TVs and other electronic devices, but also widely used in smart watches, bracelets and other smart devices. OLED display panels which use organic light emitting diodes as light emitting devices are common, especially the LTPO (Low Temperature Polycrystalline Oxide) display panel, which is a hot spot for research due to its low power consumption. However, the structure of existing OLED display panels is complex and the manufacturing cost is high.

It should be noted that the information disclosed in the above background technology section is intended only to enhance the understanding of the background of the present disclosure, and thus may include information that does not constitute prior art known to those of ordinary skill in the art.

SUMMARY

The present disclosure provides a display apparatus, a display panel, and a method of manufacturing the display panel.

According to an aspect of the present disclosure, there is provided a display panel, including:

- a substrate;
- a transistor layer, disposed on a side of the substrate and including a storage capacitor and a plurality of transistors, the transistors including a first type of transistor and a second type of transistor, material of an active layer of the first type of transistor including silicon, and material of an active layer of the second type of transistor including a metal oxide;
- a wiring layer, disposed on a side of the transistor layer away from the substrate and connected to the transistor layer to form a plurality of pixel circuits, wherein the wiring layer includes a first power supply line and a data line connected to the pixel circuits, and an orthographic projection of the first power supply line on the substrate does not overlap with an orthographic projection of the second type of transistor on the substrate;
- a flat layer, covering the wiring layer;
- a light emitting layer, disposed on a surface of the flat layer away from the wiring layer and including a plurality of light emitting devices, the light emitting devices including first electrodes, light emitting material layers and second electrodes laminated in a direction away from the substrate, one of the first electrodes being connected to one of the pixel circuits; the first electrode being a light-shielding structure, and at least one of the first electrodes overlapping with an active layer of one of the second type of transistor.

In an example embodiment of the present disclosure, the first electrode is provided in one-to-one correspondence with the pixel circuit in a direction perpendicular to the substrate, and any of the first electrodes overlaps with the active layer of the second type of transistor of the corresponding pixel circuit; the wiring layer is in direct contact with the flat layer, and the first electrode is in direct contact with the flat layer.

In an example embodiment of the present disclosure, the transistors of the pixel circuit include first to seventh transistors belonging to the first type of transistor and an eighth transistor belonging to the second type of transistor; the transistor layer including a first reset control line, a second reset control line, a first reset data line, a second reset data line, a first scan line, a second scan line and a light emitting control line;

- a first terminal of the first transistor is connected to the first reset data line, a second terminal of the first transistor is connected to a second terminal of the second transistor and a first terminal of the eighth transistor, a gate of the first transistor is connected to the first reset control line;
- a first terminal of the second transistor is connected to a second terminal of the third transistor and a first terminal of the sixth transistor, a gate of the second transistor is connected to the first scan line;
- a first terminal of the third transistor is connected to a second terminal of the fourth transistor and a second terminal of the fifth transistor;
- a gate of the fourth transistor is connected to the first scan line; a first terminal of the fourth transistor is connected to the data line;
- a gate of the fifth transistor and a gate of the sixth transistor are connected to the light emitting control line; a first terminal of the fifth transistor is connected to the first power supply line;
- a second terminal of the sixth transistor and a second terminal of the seventh transistor are connected to the first electrode;
- a gate of the seventh transistor is connected to the second reset control line;
- a first electrode plate of the storage capacitor and a gate of the third transistor are connected to the second terminal of the second transistor, and a second electrode plate of the storage capacitor is connected to the first power supply line;
- a gate of the eighth transistor is connected to the second scan line and a second terminal of the eighth transistor is connected to the gate of the third transistor.

In an example embodiment of the present disclosure, the transistor layer includes:

- a first semiconductor layer, disposed on a side of the substrate and including an active layer of the first to seventh transistors;
- a first gate insulating layer, covering the first semiconductor layer;
- a first gate layer, disposed on a surface of the first gate insulating layer away from the substrate and including the first reset control line, the first scan line, the light emitting control line and the first electrode plate;
- a second gate insulating layer, covering the first gate layer;
- a second gate layer, disposed on a surface of the second gate insulating layer away from the substrate and including the first reset data line, the second reset data line and the second electrode plate;
- a first isolation layer, covering the second gate layer;
- a second semiconductor layer, disposed on a surface of the first isolation layer away from the substrate, and including an active layer of the eighth transistor;
- a third gate insulating layer, covering the second semiconductor layer;

a third gate layer, disposed on a surface of the third gate insulating layer away from the substrate, and including the second scan line;

a second isolation layer, covering the third gate layer; the wiring layer disposed on a surface of the second isolation layer away from the substrate.

In an example embodiment of the present disclosure, the first electrode includes an electrode part and a connecting part and a shielding part extending outward from an edge of the electrode part;

the light emitting material layer is disposed on a surface of the electrode part away from the substrate;

in one of the pixel circuits and its corresponding first electrode, the active layer of the eighth transistor overlaps with the shielding part, and the connecting part is connected to the second terminal of the sixth transistor.

In an example embodiment of the present disclosure, the first scan line, the second scan line and the light emitting control line all extend in a row direction and are distributed at intervals along a column direction, the first scan line is located between the light emitting control line and the second scan line;

the first electrode plate and the second electrode plate are located between the first scan line and the light emitting control line;

the second semiconductor layer extends along the column direction and overlaps with the second scan line to constitute the eighth transistor;

the first semiconductor layer includes a first active part, a second active part and a third active part distributed along the row direction; the first active part and the second active part both extend along the column direction and are distributed along the row direction, the third active part is connected between the first active part and the second active part; the first scan line overlaps with the first active part to constitute the fourth transistor; the first scan line overlaps with the second active part to constitute the second transistor; the light emitting control line overlaps with the first active part to constitute the fifth transistor; the light emitting control line overlaps with the second active part to constitute the sixth transistor; and the first electrode plate overlaps with the third active part to constitute the third transistor;

in one of the first electrodes and a pixel circuit connected thereto, at least a part region of the electrode part is located between the first active part and the second active part, both the first scan line and the second scan line overlap with the shielding part; the connecting part is located on a side of the electrode part away from the shielding part and overlaps with the light emitting control line.

In an example embodiment of the present disclosure, both the data line and the first power supply line overlap with the first electrode and are located between the first active part and the second active part, the first power supply line is located between the data line and the second active part;

the first active part has one end extending to a side of the first scan line away from the light emitting control line and has a first contact part extending toward the second active part; the first active part has another end extending to a side of the light emitting control line away from the first scan line and has a second contact part extending toward the second active part;

both the first contact part and the second contact part overlap with the data line, and the data line is connected to the first contact part; the first power supply line overlaps with and is connected to the second contact part.

In an example embodiment of the present disclosure, the first reset control line is located on a side of the second scan line away from the first scan line and extends along the row direction:

the second semiconductor layer has one end extending to a side of the second scan line away from the first scan line, and has another end overlapping with the first scan line; the second active part extends to the side of the second scan line away from the first scan line and overlaps with the first reset control line to constitute the first transistor;

the wiring layer further includes a first adapter part and a second adapter part, the first adapter part extends along the column direction and is located between the first power supply line and the second active part, the first adapter part is connected to the first electrode plate and a part where the second semiconductor layer overlaps with the first scan line;

the second adapter part extends along the row direction and is located on a side of the second scan line away from the first scan line, the second adapter part is connected to a part of the second semiconductor layer and the second active part located on the second scan line away from the first scan line;

the first adapter part overlaps with the shielding part, both the electrode part and the shielding part overlap with the second adapter part.

In an example embodiment of the present disclosure, the second electrode plate of the storage capacitor is provided with at least one through hole; the first power supply line extends along the column direction, an orthographic projection of the first power supply line on the substrate does not overlap with an orthographic projection of at least one of the first adapter part, the second adapter part and the through hole of the second electrode plate on the substrate.

In an example embodiment of the present disclosure, the second gate layer further includes an auxiliary scan line, the auxiliary scan line extends along a row direction, and the auxiliary scan line overlaps with and is connected to the second scan line;

in the column direction, a boundary of an orthographic projection of the auxiliary scan line on the substrate is located within an orthographic projection of the second scan line on the substrate, and another boundary of the orthographic projection of the auxiliary scan line on the substrate is located outside the orthographic projection of the second scan line on the substrate.

In an example embodiment of the present disclosure, the second gate layer includes an auxiliary power supply line, the auxiliary power supply line is connected to the first power supply line.

In an example embodiment of the present disclosure, the auxiliary power supply line is in an integral structure with the second electrode plate and extends along a row direction; the first power supply line is connected to the second electrode plate.

According to an aspect of the present disclosure, there is provided a method of manufacturing a display panel, including:

forming a transistor layer having a plurality of pixel circuits on a side of a substrate, the pixel circuits including a storage capacitor and a plurality of transistors, the transistors including a first type of transistor and a second type of transistor, material of an active layer of the first type of transistor including silicon, and material of an active layer of the second type of transistor including a metal oxide;

forming a wiring layer on a side of the transistor layer away from the substrate, wherein the wiring layer includes a first power supply line and a data line connected to the pixel circuits;

forming a flat layer covering the wiring layer;

forming a light emitting layer including a plurality of light emitting devices on a surface of the flat layer away from the wiring layer, the light emitting devices including first electrodes, light emitting material layers and second electrodes laminated in a direction away from the substrate, one of the first electrodes being connected to one of the pixel circuits; the first electrode being a light-shielding structure, and at least one of the first electrodes overlapping with an active layer of one of the second type of transistor.

According to an aspect of the present disclosure, there is provided a display apparatus, including any of the display panels described above.

It should be understood that the above general description and the later detailed descriptions are exemplary and explanatory only and do not limit the present disclosure.

BRIEF DESCRIPTION OF THE DRAWINGS

The accompanying drawings herein are incorporated into and form part of the specification, illustrate embodiments consistent with the present disclosure, and are used in conjunction with the specification to explain the principles of the present disclosure. It will be apparent that the accompanying drawings in the following description are only some embodiments of the present disclosure, and that other drawings may be obtained from the accompanying drawings without creative effort by one of ordinary skill in the art.

DETAILED DESCRIPTION

Figure 1:
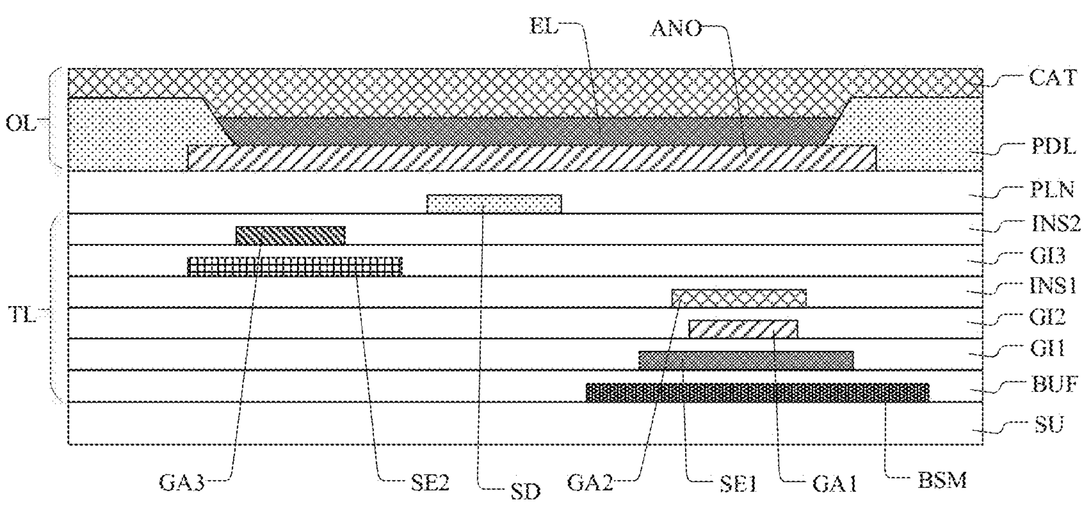
FIG. 1 is a cross-section schematic diagram of a display panel of an embodiment of the present disclosure.

The example embodiments will now be described more fully with reference to the accompanying drawings. However, the example embodiments can be implemented in a variety of forms and should not be construed as being limited to the examples set forth herein; rather, the provision of these embodiments makes the present disclosure more comprehensive and complete and communicates the ideas of the example embodiments to those skilled in the art in a comprehensive manner. The same reference numerals in the drawings indicate the same or similar structures, and thus their detailed description will be omitted. In addition, the accompanying drawings are only schematic illustrations of the present disclosure and are not necessarily drawn to scale.

The terms "a". "an". "the", "said" and "at least one" are used to indicate the presence of one or more elements/components/etc.; the terms "including" and "having" are used to indicate an open-ended inclusion and refer to the presence of additional elements/components/etc. in addition to the listed elements/components/etc.; the terms "first", "second", etc. are used as markers only and are not limitations on the number of objects.

The row direction X and column direction Y in this document are only two mutually perpendicular directions. In the accompanying drawings of this disclosure, the row direction X may be horizontal and the column direction Y may be vertical, but not limited to this. The actual orientation of the row direction X and column direction Y may change if the display panel is rotated. The X direction in the accompanying drawings exemplarily illustrates the row direction, and the Y direction exemplarily illustrates the column direction.

The A and B features "overlapping" herein means that the orthographic projection of the A feature on the substrate and the orthographic projection of the B feature on the substrate at least partially overlap. The A and B features "not overlapping" herein means that the area of the overlapping area of the orthographic projection of the A feature on the substrate and the orthographic projection of the B feature on the substrate is zero.

Figure 2:
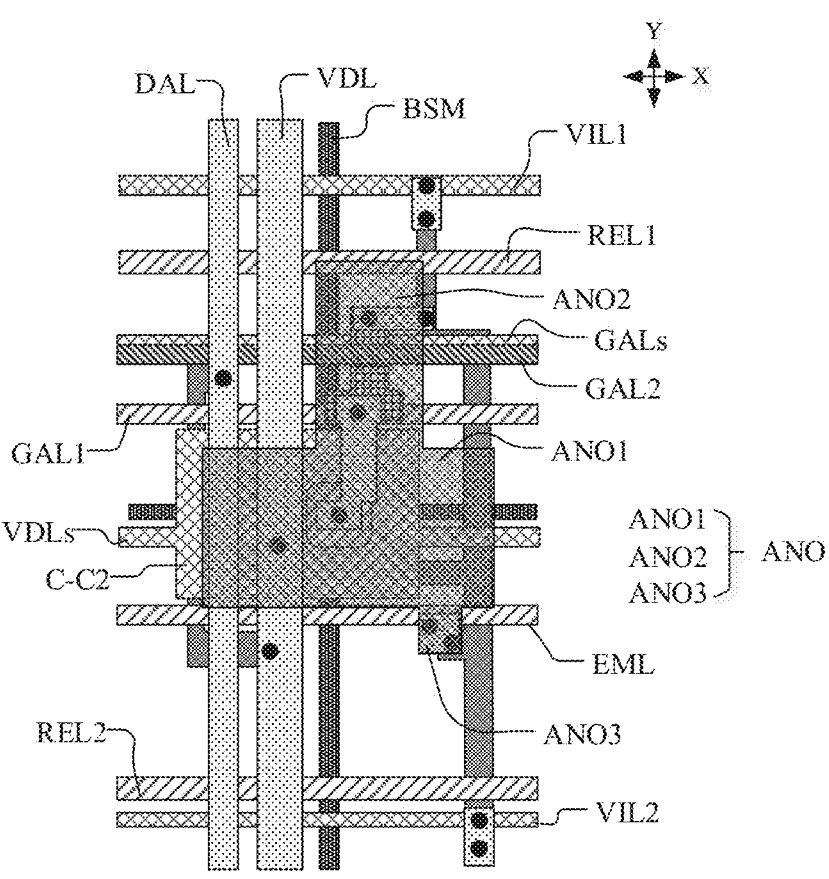
FIG. 2 is a partial top view of the pixel circuit and the first electrode of a display panel in an embodiment of the present disclosure.

The embodiment of the present disclosure provides a display panel, as shown in FIGS. 1 and 2. The display panel may include a substrate SU, a transistor layer TL, a wiring layer SD, a flat layer PLN, and a light emitting layer OL.

The transistor layer TL is disposed on a side of the substrate and has a plurality of pixel circuits. The pixel circuits include a storage capacitor and a plurality of transistors. The transistors include a first type of transistor and a second type of transistor. The material of an active layer of the first type of transistor includes silicon, and the material of an active layer of the second type of transistor includes a metal oxide.

The wiring layer SD is disposed on a side of the transistor layer TL away from the substrate SU and includes a first power supply line VDL and a data line DAL connected to the pixel circuits. An orthographic projection of the first power supply line VDL on the substrate SU does not overlap with an orthographic projection of the second type of transistor on the substrate SU.

The flat layer PLN covers the wiring layer SD.

The light emitting layer OL is disposed on a surface of the flat layer PLN away from the wiring layer SD and includes a plurality of light emitting devices. The light emitting devices include first electrodes ANO, light emitting material layers EL, and second electrodes CAT laminated in a direction away from the substrate SU. One of the first electrodes ANO is connected to one of the pixel circuits. The first electrode ANO is a light-shielding structure, and at least one of the first electrodes ANO overlaps with an active layer of one of the second type of transistor.

In the display panel of the present disclosure, the light emitting device may adopt a top-emitting structure, and the first electrode ANO is a light-shielding structure. In order to avoid the problem that the electrical characteristics of the second type of transistor, i.e., the metal oxide transistor, change, such as threshold voltage shift, due to the influence of external light, the active layer of the second type of transistor may overlap with the first electrode ANO. That is, the first electrode ANO is used to shield the second type of transistor, to prevent external light from irradiating the second type of transistor, thereby preventing changes in electrical characteristics such as threshold voltage shift and ensuring its electrical performance stability. At the same time, since the second type of transistor is shielded by means of the first electrode ANO of the light emitting device, it can avoid setting a special film layer for the second type of transistor to shield light, which is conducive to simplifying the structure and reducing the thickness and cost of the display panel. For example, it can avoid setting another shielding wiring layer that shields the second type of transistor on the side of the wiring layer SD away from the substrate SU, and accordingly, it can also avoid setting the flat layer covering the shielding wiring layer in order to achieve flatness. That is, the display panel of an embodiment of the present disclosure can have only one wiring layer SD and one flat layer PLN between the transistor layer TL and the first electrode ANO. That is, the wiring layer SD is in direct contact with the flat layer PLN, and the first electrode ANO is in direct contact with the flat layer PLN, which simplifies the structure and reduces the thickness and manufacturing cost of the display panel.

The overall architecture of the display panel of the present disclosure is described below.

The display panel may include a driving backplane for driving the light emitting device to emit light, which may be formed by a plurality of film layers. For example, as shown in FIG. 1, the driving backplane may include a substrate SU and a transistor layer TL, a wiring layer SD, and a flat layer PLN laminated on a side of the substrate SU.

The substrate SU may be a base of the driving backplane, which may carry the transistor layer TL. The substrate SU may be a rigid or flexible structure, which may be a single-layer or multi-layer structure, without any special limitation herein. The driving backplane may have a driving circuit, for driving each light emitting device of the light emitting layer OL to emit light independently, to display an image. Meanwhile, the driving backplane may include a pixel area and a peripheral area located outside the pixel area. For example, the peripheral area may be a continuous or discontinuous annular area surrounding the pixel area.

The driving circuit may include a pixel circuit and a peripheral circuit. The pixel circuit may be located within the pixel area. Also, there may be a part of the area of a part of the pixel circuit located in the peripheral area. The peripheral circuit is located within the peripheral area, and the peripheral circuit is connected to the pixel circuit, for inputting a driving signal to the pixel circuit, in order to control the light emitting device to emit light. The peripheral circuit may include a gate driving circuit and a light emitting control circuit, etc. The peripheral circuit may also include a source driving circuit or other circuits, and the specific structure of the peripheral circuit is not specifically limited herein.

Each pixel circuit may include a plurality of transistors and a storage capacitor. The transistors may include the first type of transistor and the second type of transistor, and the number of the two types of transistors is not limited. The first type of transistor may be a polysilicon transistor, i.e., the active layer of the first type of transistor is polysilicon. The second type of transistor may be a metal oxide transistor, i.e., the active layer of the second type of transistor is metal oxide, such as IGZO (Indium Gallium Zinc Oxide), etc. Each transistor may be distributed in the transistor layer TL. At the same time, the transistor layer TL may also include a wiring for transmitting signals to the pixel circuit.

As shown in FIG. 2, the wiring layer SD is provided on the side of the transistor layer TL away from the substrate, and at least includes a first power supply line VDL and a data line DAL connected to the pixel circuit. The wiring layer SD and the transistor layer TL may form a driving circuit, which may include the pixel circuit.

As shown in FIG. 1, the flat layer PLN may cover the wiring layer SD, and the material of the flat layer PLN may be organic material such as transparent resin. The surface of the flat layer PLN away from the driving backplane is flat, so that a light emitting device may be provided thereon.

As shown in FIG. 1, the light emitting layer OL is provided on the surface of the flat layer PLN away from the wiring layer SD. The light emitting layer OL may include a plurality of light emitting devices distributed in a plurality of arrays and a pixel definition layer defining each light emitting device.

The light emitting devices may include first electrodes ANO, light emitting material layers EL and second electrodes CAT laminated in a direction away from the substrate SU. One of the first electrodes ANO is connected to one of the pixel circuits. The first electrode ANO is a light-shielding structure, and at least one of the first electrodes ANO overlaps with an active layer of a second type of transistor.

The pixel definition layer PDL may be provided on the surface of the flat layer PLN away from the substrate SU. The pixel definition layer PDL is used to separate the individual light emitting devices. Specifically, the pixel definition layer PDL can be provided with a plurality of openings. The range defined by each opening is the range of a light emitting device. The light emitting device may be an organic light emitting diode, which may include a first electrode ANO, a light emitting material layer EL and a second electrode CAT laminated sequentially along the direction away from the substrate SU.

The first electrode ANO may be provided on the same surface of the driving backplane with the pixel definition layer PDL, which may serve as the anode of the light emitting device. Each opening of the pixel definition layer ANO exposes each first electrode ANO in one-to-one correspondence. The first electrode ANO may be a single-layer or multi-layer structure, and its material may include one or more of a conductive metal, metal oxide, and alloy. The first electrode ANO may be a light-shielding structure. For example, the first electrode ANO may include three metal layers. The material of the middle metal layer may be silver, aluminum, etc., and the material of the other two metal layers may be titanium or other metals, without special limitation herein.

In some embodiments of the present disclosure, in the direction perpendicular to the substrate SU, the first electrodes ANO may be provided and connected to the pixel circuits one by one, i.e., each pixel circuit may be used to drive one light emitting device. Any of the first electrodes ANO and the active layer of the second type of transistor of the corresponding pixel circuit overlap, so that the second type of transistor can be shielded by the first electrode ANO, to attenuate or avoid changes in the electrical characteristics of the second type of transistor caused by external light irradiation to the second type of transistor, thereby ensuring that the light emitting device emits light normally.

The light emitting material layer EL is at least partially provided in the opening, and may include a hole injection layer, a hole transport layer, a light emitting material layer, an electron transport layer and an electron injection layer laminated sequentially along the direction away from the substrate SU. The holes and electrons can be compound into excitons in the light emitting material layer, the excitons radiate photons, so as to produce visible light, the specific light emitting principle is not detailed here. The light emitting material layer EL can be a continuous whole-layer structure, so that each light emitting device can share the same light emitting material layer EL, each light emitting device lights the same color. In order to achieve color display, a color film layer having a plurality of filtering parts can be provided on the side of the light emitting layer OL away from the substrate SU, and the color display may be achieved through the light emitting device and the corresponding filtering part. The light emitting material layer EL can also be distributed in an array. Each light emitting device has an independent light emitting material layer EL, so that each light emitting device can independently emit light, and the colors emitted by different light emitting devices can be different.

The second electrode CAT can cover the light emitting material layer, which can be used as the cathode of the light emitting device. The second electrode CAT can be a single-layer or multi-layer structure, and its material can include one or more of the conductive metal, metal oxide and alloy. Each light emitting device may share the same second electrode CAT. Specifically, the second electrode CAT is a continuous conductive layer covering the pixel-defining layer PDL and the light emitting material layer EL of each light emitting device. That is, the second electrode CAT covers each opening in the orthographic projection of the pixel-defining layer PDL.

In some embodiments of the present disclosure, the display panel may also include an encapsulation layer, which may cover the light emitting layer OL, for protecting the light emitting layer OL and blocking external water and oxygen from eroding the light emitting device. By way of example, the encapsulation layer may be encapsulated by means of thin film encapsulation, which may include a first inorganic layer, an organic layer and a second inorganic layer. The first inorganic layer covers the light emitting layer OL. The organic layer may be provided on the surface of the first inorganic layer away from the driving backplane, and the boundary of the organic layer is limited to the inner side of the boundary of the first inorganic layer. The boundary of the orthographic projection of the organic layer on the driving backplane may be located in the peripheral area, to ensure that the organic layer can cover each light emitting device. The second inorganic layer may cover the organic layer and the first inorganic layer not covered by the organic layer, and may block water and oxygen intrusion through the second inorganic layer, and achieve the flattening through the flexible organic layer.

In addition, in some embodiments of the present disclosure, the display panel may also include a transparent cover plate, which may be bonded to the polarizing layer and achieve the flattening. The transparent cover plate is used to protect the film layer underneath, and its material may be transparent material such as glass or acrylic, without any special limitation herein.

The structure of the pixel circuit of the present disclosure is illustrated exemplarily below.

Figure 3:
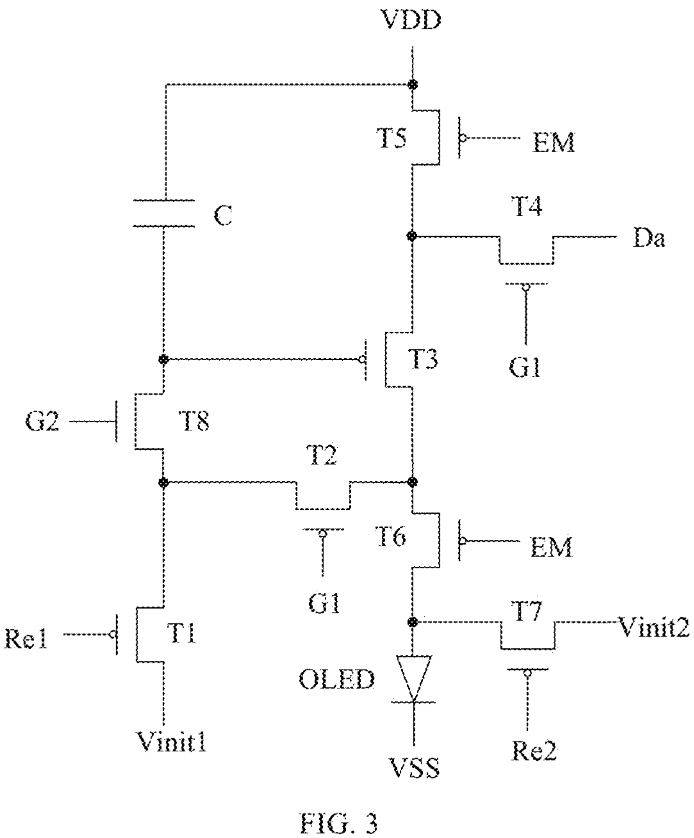
FIG. 3 is a principle diagram of the pixel circuit of a display panel in an embodiment of the present disclosure.

In some embodiments of the present disclosure, as shown in FIGS. 2 and 3, the pixel circuit may be an 8T1C structure, i.e., it may have eight transistors and one capacitor. Specifically, as shown in FIG. 3, the transistors of the pixel circuit include a first transistor T1, a second transistor T2, a third transistor T3, a fourth transistor T4, a fifth transistor T5, a sixth transistor T6, and a seventh transistor T7 belonging to the first type of transistor, and also include an eighth transistor T8 belonging to the second type of transistor; and the third transistor T3 is a driver transistor.

A first terminal of the first transistor T1 is connected to the first reset data line VIL1, a second terminal of the first transistor T1 is connected to a second terminal of the second transistor T2 and a first terminal of the eighth transistor T8, a gate of the first transistor T1 is connected to the first reset control line REL1 for receiving the reset control signal Re1. A first terminal of the second transistor T2 is connected to a second terminal of the third transistor T3 and a first terminal of the sixth transistor T6, a gate of the second transistor T2 is connected to the first scan line GAL1 for receiving the first scan signal G1. The gate of the third transistor T3 is connected to the second terminal of the eighth transistor T8, and the first terminal of the third transistor T3 is connected to a second terminal of the fourth transistor T4 and a second terminal of the fifth transistor T5. A gate of the fourth transistor T4 is connected to the first scan line GAL1 for receiving the first scan signal G1; a first terminal of the fourth transistor T4 is connected to the data line DAL for receiving the data signal Da. A gate of the fifth transistor T5 and a gate of the sixth transistor T6 are connected to the light emitting control line EML for receiving the light emitting control signal EM. A first terminal of the fifth transistor T5 is connected to the first power supply line VDL for receiving the first power signal VDD. A gate of the seventh transistor T7 is connected to the second reset control line REL2 for receiving the second reset control signal Re2. The storage capacitor C includes a first electrode plate C1 and a second electrode plate C2 that are opposite. The first electrode plate C1 is connected to the gate of the third transistor T3, and the second electrode plate C2 is connected to the first power supply line VDL. A gate of the eighth transistor T8 is connected to the second scan line GAL2 for receiving the second scan signal G2.

The pixel circuit may be connected to a light emitting device, for driving the light emitting device to emit light. The light emitting device may be connected between the second terminal of the sixth transistor T6 and the second power supply line VSS. The first transistor T1, the second transistor T2, the third transistor T3, the fourth transistor T4, the fifth transistor T5, the sixth transistor T6, and the seventh transistor T7 can be P-type polysilicon transistors. The P-type low temperature polysilicon transistors have high carrier mobility, thereby facilitating the realization of a display panel with high resolution, high response rate, high pixel density, and high opening rate.

The eighth transistor T8 can be an N-type metal oxide transistor, and the N-type metal oxide transistor has a small leakage current to avoid that the third transistor T3 leaks through the first transistor T1 in the light emitting phase.

The first reset data line VIL1 and the second reset data line VIL2 can output the same or different voltage signals depending on the actual situation.

Figure 4:
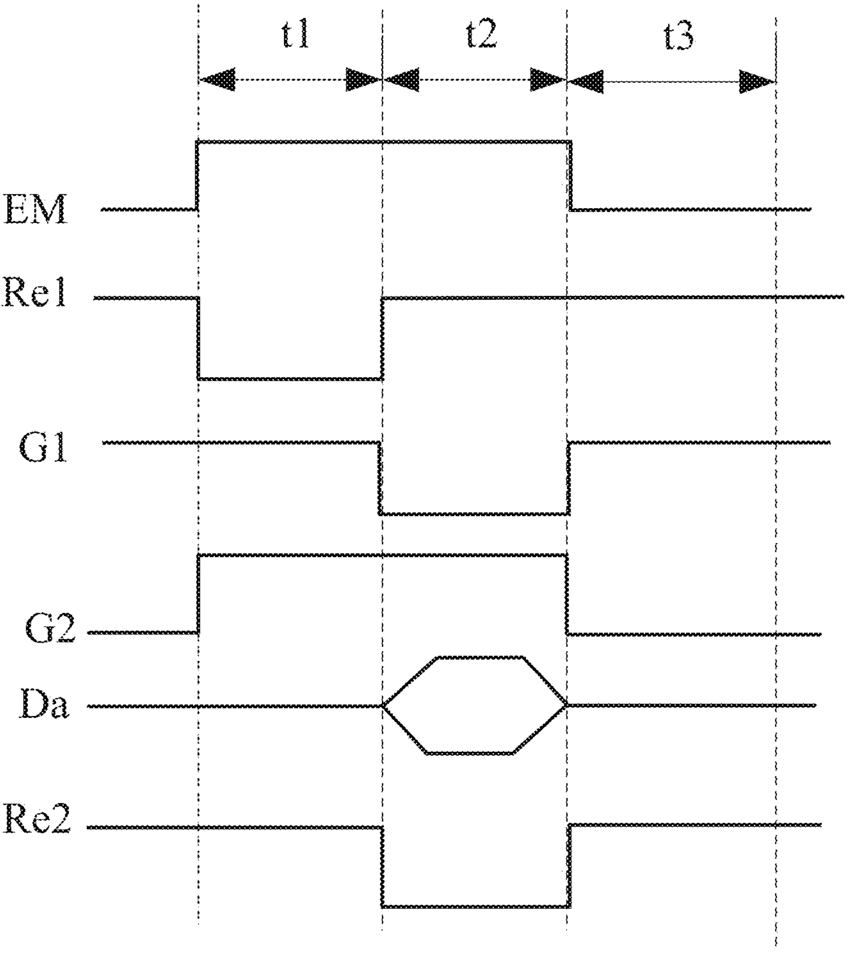
FIG. 4 is a timing diagram of the pixel circuit of a display panel in an embodiment of the present disclosure.

As shown in FIG. 4, G1 indicates the timing of the first scan signal, G2 indicates the timing of the second scan signal, Re1 indicates the timing of the first reset control signal, Re2 indicates the timing of the second reset control signal, and EM indicates the timing of the light emitting control signal. The driving method of the pixel circuit may include a first reset phase t1, a compensation phase t2, a second reset phase t3, and a light emitting phase t4.

In the first reset stage t1, the first reset control signal Re1 output by the first reset control line REL1 is a low level signal, and the first transistor T1 is turned on. The second scan signal G2 output by the second scan line GAL2 is a high level signal and the eighth transistor T8 is turned on. The first reset data line VIL1 inputs the first reset data signal Vinit1 to the gate of the third transistor T3.

In compensation stage t2, the first scan signal G1 output by the first scan line GAL1 is a low level signal, the second scan signal G2 output by the second scan line GAL2 is a high level signal, the second transistor T2, the fourth transistor T4 and the eighth transistor T8 are turned on. At the same time, the data line DAL outputs the data signal Da and writes the voltage Vdata+Vth (i.e., the sum of voltages Vdata and Vth), where Vdata is the voltage of data signal Da and Vth is the threshold voltage of the third transistor T3.

At the same time, the second reset control signal Re2 output by the second reset control line REL2 is a low level signal, the seventh transistor T7 is turned on, and the second reset data line VIL2 inputs the second reset signal Vinit2 to the second terminal of the sixth transistor T6 and the first electrode of the light emitting device OLED.

In the light emitting stage t3, the light emitting control signal EM output by the light emitting control line EML is a low level signal, the sixth transistor T6 and the fifth transistor T5 are turned on, and the third transistor T3 emits light under the action of the voltage Vdata+Vth stored in the storage capacitor C.

The current output by the third transistor T3 as a driver transistor satisfies the following equation:

$$I=(\mu WCox/2L)(Vgs-Vth)^2$$

where, I is the output current of the third transistor T3; μ is the carrier mobility; Cox is the gate capacitance per unit area, W is the width of the channel of the third transistor T3, L is the channel length of the third transistor T3, Vgs is the gate source voltage difference of the third transistor T3, and Vth is the threshold voltage of the third transistor T3.

According to the above formula of the output current of the third transistor T3, substituting the source voltage Vdd and the gate voltage Vdata+Vth of the driver transistor in the pixel circuit of the present disclosure into the above formula, it can obtain that the output current I of the third transistor T3 equals $(\mu WCox/2L)(Vdata+Vth-Vdd-Vth)^2$. It can be seen that the output current of the pixel circuit is irrelated to the threshold voltage Vth of the third transistor T3, but only related with Vdata, thus eliminating the influence of the threshold voltage of the third transistor T3 on its output current. The control of the output current can be achieved by only Vdata, in order to control the luminance of the light emitting device.

As shown in FIG. 2, FIG. 5-FIG. 12, the following exemplarily illustrates the pattern of the wiring layer SD and the transistor layer TL based on the pixel circuit of 8T1C of the above implementation.

Figure 5:
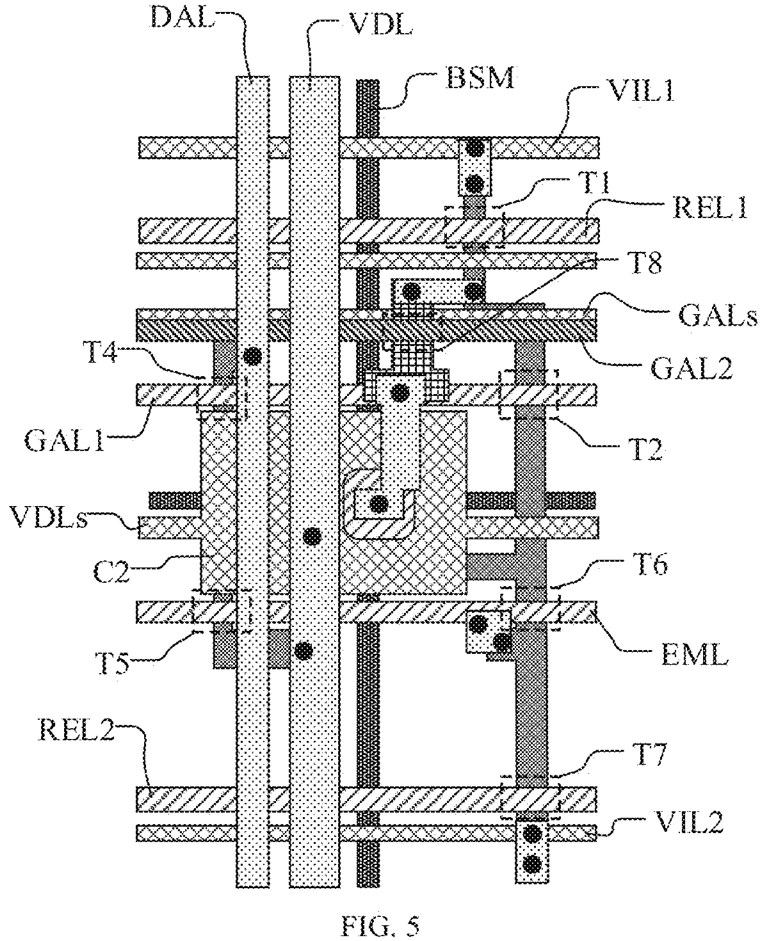
FIG. 5 is a partial top view of the pixel circuit of a display panel in an embodiment of the present disclosure.
Figure 6:
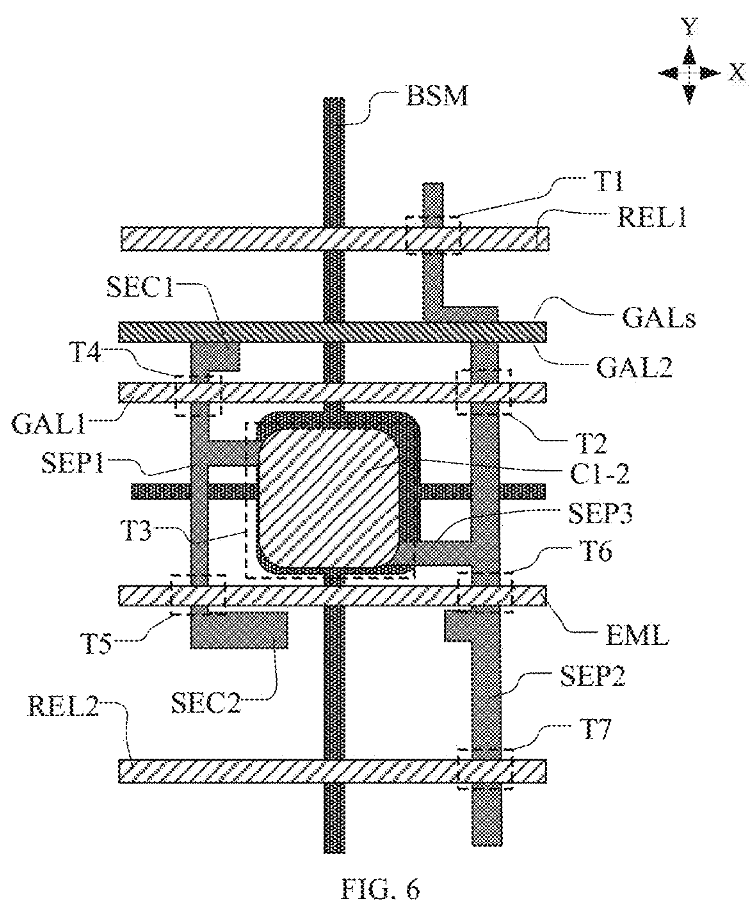
FIG. 6 is a partial top view of the first to seventh transistors of the pixel circuit of a display panel in an embodiment of the present disclosure.
Figure 13:
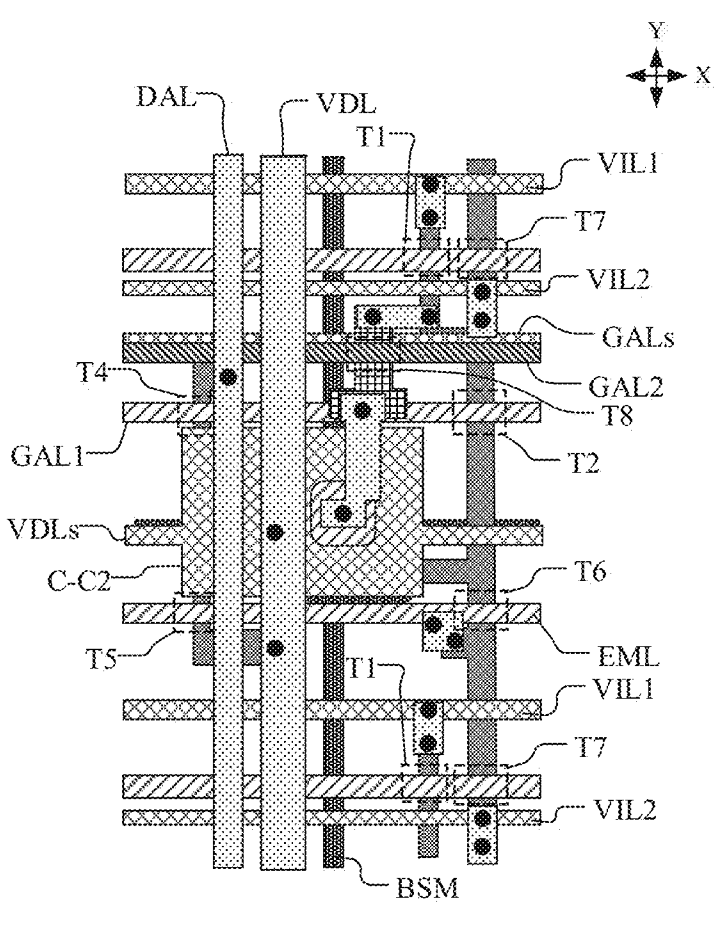
FIG. 13 is a partial top view of two adjacent rows of pixel circuits of a display panel in an embodiment of the present disclosure.

As shown in FIG. 2. FIG. 5, and FIG. 6, each pixel circuit can be distributed in arrays along the row direction X and the column direction Y. The same row pixel circuit is connected to the same first reset control line REL1 and is connected to the same second reset control line REL2, the same first reset data line VIL1, the same second reset data line VIL2, the same first scan line GAL1, the same second scan line GAL2, and the same light emitting control line EML. The same column pixel circuit is connected to the same data line Da and the same first power supply line VDD. In addition, as shown in FIG. 13, the first reset control line REL1 of the $(n+1)^{st}$ row pixel circuit may be multiplexed as the second reset control line REL2 of the $n^{th}$ row pixel circuit, where n is a positive integer.

In some embodiments of the present disclosure, as shown in FIGS. 1, 2, and 5, the transistor layer TL may also include a first semiconductor layer SE1, a first gate insulating layer GI1, a first gate layer GA1, a second gate insulating layer GI2, a second gate layer GA2, a first isolation layer INS1, a second semiconductor layer SE2, a third gate insulating layer GI3, a third gate layer GA3, and a second isolation layer INS2.

As shown in FIG. 2, FIG. 5 FIG. 6 and FIG. 8, the first semiconductor layer SE1 is provided on a side of the substrate SU, the first semiconductor layer SE1 may adopt polysilicon, and the active layers of the first transistor T1 to the seventh transistor T7 are located in the first semiconductor layer SE1.

The first gate insulating layer GI1 covers the first semiconductor layer SE1. The material of the first gate insulating layer G11 may be inorganic insulating material, such as silicon oxide, silicon nitride, etc.

As shown in FIGS. 2, 5, 6 and 9, the first gate layer GA1 is provided on the surface of the first gate insulating layer away from the substrate. The first gate layer GA1 may be made of metal. The first reset control line REL1, the first scan line GAL1, the light emitting control line EML and the first electrode plate C1 of the storage capacitor C mentioned above may be located in the first gate layer GA1.

The second gate insulating layer G12 covers the first gate layer GA1. The material of the first gate insulating layer G11 may be inorganic insulating material, such as silicon oxide, silicon nitride, etc.

As shown in FIG. 2, FIG. 5, FIG. 6 and FIG. 10, the second gate layer GA2 is provided on the surface of the second gate insulating layer G12 away from the substrate SU. The second gate layer GA2 may be made of metal. The first reset data line VIL1, the second reset data line VIL2 and the second electrode plate C2 of the storage capacitor C may be located in the second gate layer GA2.

The first isolation layer INS1 covers the second gate layer GA2, which may have a single-layer or multi-layer structure, as long as it is made of insulating material. For example, the first isolation layer INS1 may include an interlayer dielectric layer and a buffer layer. The interlayer dielectric layer covers the second gate layer GA2, and the buffer layer is provided on the surface of the interlayer dielectric layer away from the substrate SU.

The second semiconductor layer SE2 may be provided on the surface of the first isolation layer INS away from the substrate SU, and its material may be a metal oxide semiconductor such as IGZO (Indium Gallium Zinc Oxide). The active layer of the eighth transistor T8 is located in the second semiconductor layer SE2.

The third gate insulating layer GI3 covers the second semiconductor layer SE2. The material of the third gate insulating layer G13 may be inorganic insulating material, such as silicon oxide, silicon nitride, etc.

The third gate layer GA3 is provided on the surface of the third gate insulating layer G13 away from the substrate SU, and the third gate layer GA3 may be made of metal. The second scan line GAL2 may be located in the third gate layer GA3.

The second isolation layer INS2 covers the third gate layer GA3, and the second isolation layer INS2 may have a single-layer or multi-layer structure, as long as it is made of insulating material. For example, the second isolation layer INS2 may include an interlayer dielectric layer and a passivation layer. The interlayer dielectric layer covers the third gate layer GA3, and the passivation layer is provided on the surface of the interlayer dielectric layer away from the substrate SU.

As shown in FIGS. 2, 5, 6 and 11, the wiring layer SD may be provided on the surface of the second isolation layer INS2 away from the substrate SU. The flat layer PLN covers the wiring layer SD and the second isolation layer INS2 that is not covered by the wiring layer SD.

Figure 7:
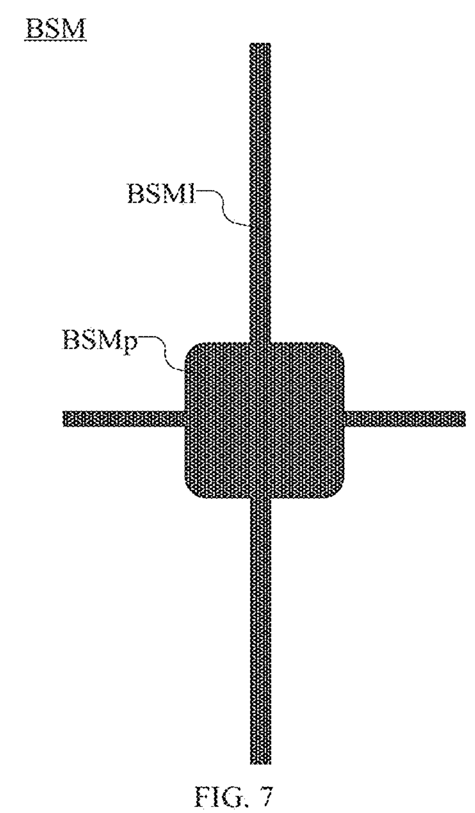
FIG. 7-FIG. 12 are partial top views of the light-shielding layer to the first electrode of a display panel in an embodiment of the present disclosure, respectively.

In addition, a light-shielding layer BSM may be provided between the substrate SU and the first semiconductor layer SE1. At least a part of the area of the light-shielding layer BSM may overlap with at least a part of the channel region of the transistor, to shield the light irradiated toward the transistor, to make the electrical characteristics of the transistor stable. As shown in FIGS. 6 and 7, and the light-shielding layer BSM may shield the third transistor T3. Meanwhile, the light-shielding layer BSM may be covered by the buffer layer BUF, and the first semiconductor layer SE1 may be provided on the surface of the buffer layer BUF away from the substrate SU.

In some embodiments of the present disclosure, the eighth transistor T8 may be located between the first transistor T1 to the seventh transistor T7 and the substrate SU. For example, the first semiconductor layer SE1 may be made of metal oxide, and the second semiconductor layer SE2 may be made of silicon. Therefore, the active layer of the eighth transistor T8 is located in this first semiconductor layer SE1; the active layer of at least one of the first transistor T1 to the seventh transistor T7 is located in this second semiconductor layer SE2.

The following is an example description of the specific structure of the pixel circuit based on the film layers described above.

As shown in FIGS. 2, 5 and 6, the first scan line GAL1, the second scan line GAL2, and the light emitting control line EML all extend along the row direction and are spaced apart along the column direction. The first scan line GAL1 is located between the light emitting control line EML and the second scan line GAL2.

The first reset control line REL1, the second reset control line REL2, the first reset data line VIL1 and the second reset data line VIL2 also extend along the row direction and are distributed at intervals along the column direction. The first reset control line REL1 and the first reset data line VIL1 are located on the side of the second scan line GAL2 away from the first scan line GAL1, and the first reset control line REL1 is located between the first reset data line VIL1 and the first scan line GAL1. Meanwhile, the second reset control line REL2 and the second reset data line VIL2 are located on the side of the light emitting control line EML away from the first scan line GAL1, and the second reset control line REL2 is located between the second reset data line VIL2 and the first scan line GAL1.

The first electrode plate C1 and the second electrode plate C2 of the storage capacitor C are disposed between the first scan line GAL1 and the light emitting control line EML, and overlap in a direction perpendicular to the substrate SU.

The first semiconductor layer SE1 may include a first active part SEP1, a second active part SEP2, and a third active part SEP3 distributed along the row direction.

Both the first active part SEP1 and the second active part SEP2 extend along the column direction and are distributed along the row direction, and the third active part SEP3 is connected between the first active part SEP1 and the second active part SEP2. The first active part SEP1 is located between the second scan line GAL2 and the second reset control line REL2. The third active part SEP3 is located between the first scan line GAL1 and the light emitting control line EML. The two ends of the second active part SEP2 extend to the outside of the first reset control line REL1 and the second reset control line REL2, respectively.

The first scan line GAL1 and the first active part SEP1 overlap to form the fourth transistor T4, and the area where the first scan line GAL1 overlaps with the first active part SEP1 is the gate of the fourth transistor T4, and the area where the first active part SEP1 overlaps with and the first scan line GAL1 is the channel region of the active layer of the fourth transistor T4.

The first scan line GAL1 overlaps with the second active part SEP2, to form the second transistor T2. The light emitting control line EML overlaps with the first active part SEP1 to form the fifth transistor T5. The light emitting control line EML overlaps with the second active part SEP2 to form the sixth transistor T6. The areas where the light emitting control line EML overlaps with the first active part SEP1 and the second active part SEP2 are the gates of the fifth transistor T5 and the sixth transistor T6, respectively, and the area where the first active part SEP1 and the second active part SEP2 overlap with the light emitting control line EML is the channel region of the active layer of the fifth transistor T5 and the sixth transistor T6, respectively.

Figure 8:
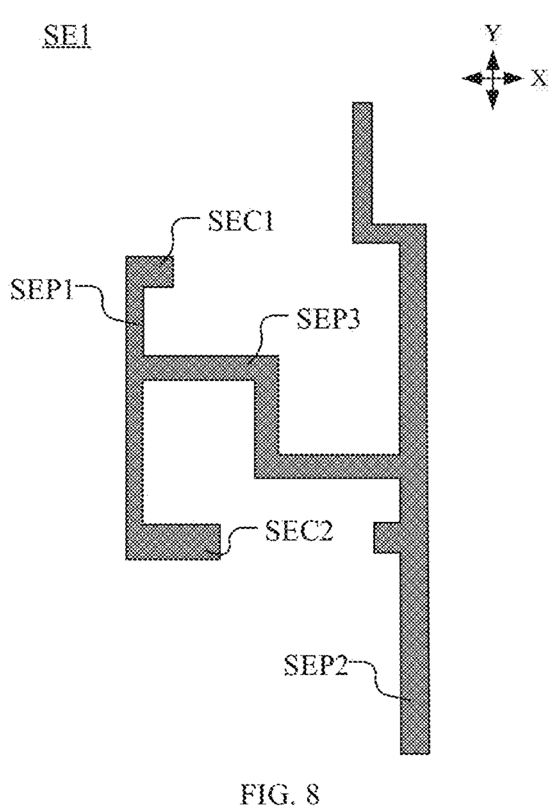
Figure 9:
Figure 9:
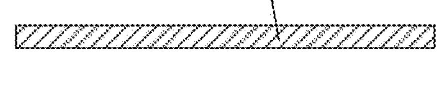
Figure 9:
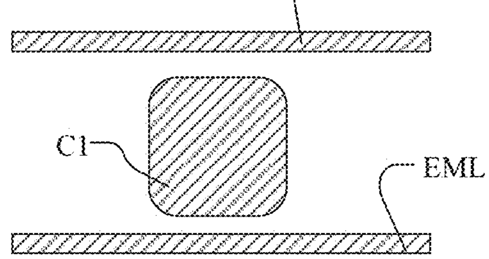
Figure 9:
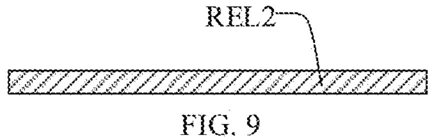
Figure 10:
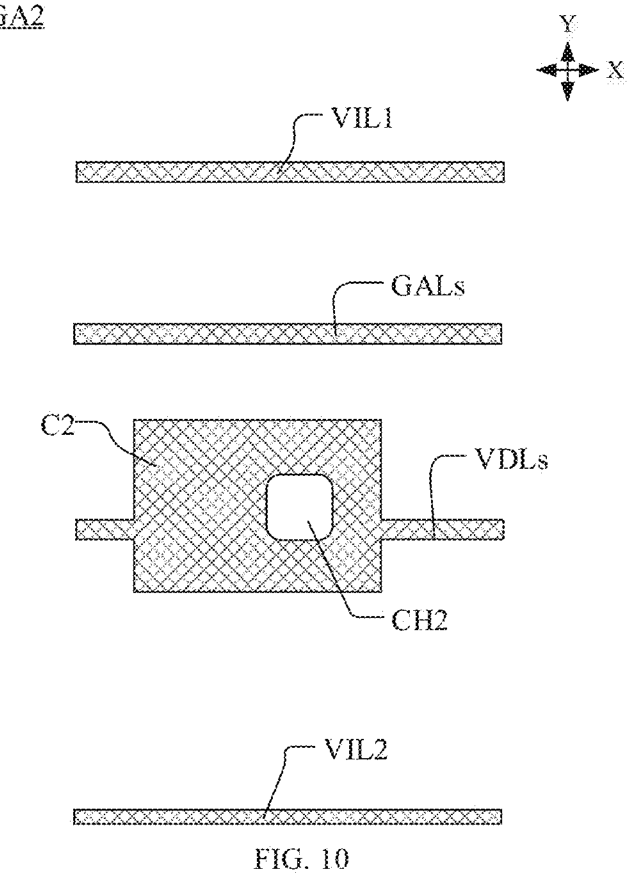

As shown in FIG. 8, the second active part SEP2 extends to the side of the second scan line GAL2 away from the first scan line GAL1 and overlaps with the first reset control line REL1, to form the first transistor T1. The area where the first reset control line REL1 overlaps with the first active part SEP1 is the gate of the first transistor T1, and the area where the first active part SEP1 overlaps with the first reset control line REL1 is the channel region of the active layer of the first transistor T1.

The second reset control line REL2 overlaps with the second active part SEP2, to form the seventh transistor T7. The area where the second reset control line REL2 overlaps with the first active part SEP1 is the gate of the seventh transistor T7. The area where the second active part SEP overlaps with the second reset control line REL2 is the channel region of the active layer of the seventh transistor T7.

The first electrode plate C1 overlaps with the third active part SEP3, to form the third transistor T3. The area where the first electrode plate C1 overlaps with the third active part SEP3 is the gate of the third transistor T3. The area where the third active part SEP3 overlaps with the first electrode plate C1 is the channel region of the active layer of the third transistor T3. The second electrode plate C2 overlaps with the first electrode plate C1, to form a storage capacitor C.

The second semiconductor layer SE2 may extend in the column direction and overlap with the second scan line GAL2, to form the eighth transistor T8. The area where the second scan line GAL2 overlaps with the second semiconductor layer SE2 is the gate of the eighth transistor T8. The area where the second semiconductor layer SE2 overlaps with the second scan line GAL2 is the channel region of the active layer of the eighth transistor T8. The second semiconductor layer SE2 may be located between the first reset control line REL1 and the storage capacitor C. Meanwhile, one end of the second semiconductor layer SE2 extends to the side of the second scan line GAL2 away from the first scan line GAL1, and the other end thereof overlaps with the first scan line GAL1.

Figure 11:
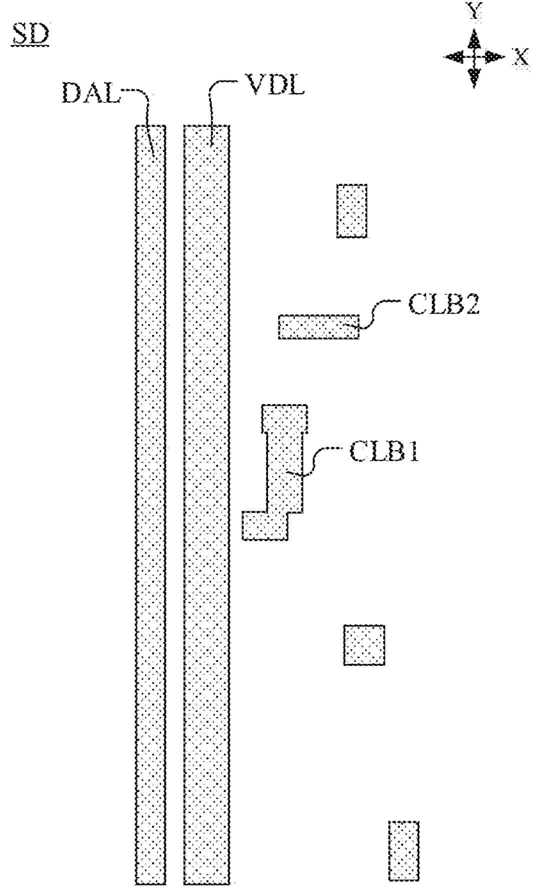

As shown in FIG. 11, both the first power supply line VDL and the data line DAL of the wiring layer SD extend in the column direction and are spaced apart along the row direction. The first power supply line VDL and the data line DAL connecting the same pixel circuit are located between the first active part SEP1 and the second active part SEP2 of the pixel circuit, and the first power supply line VDL is located between the data line DAL and the second active part SEP2.

As shown in FIG. 6, one end of the first active part SEP1 extends to the side of the first scan line GAL1 away from the light emitting control line EML, and is provided with a first contact part SEC1 extending toward the second active part SE2. The other end of the first active part SEP1 extends to the side of the light emitting control line EML away from the first scan line GAL1, and is provided with a second contact part SEC2 extending toward the second active part SEP2. Both the first contact part SEC1 and the second contact part SEC2 extend in the row direction.

Both the first contact part SEC1 and the second contact part SEC2 are of an integral structure with the first active part SEP1. Both the first contact part SEC1 and the second contact part SEC2 overlap with the data line DAL, and the data line DAL is connected to the first contact part SEC1 through a via hole, thereby connecting the data line DAL to the first terminal of the fourth transistor T4.

The first power supply line VDL overlaps with the second contact part SEC2 and they are connected through the via hole, so that the first power supply line VDL can be connected to the first terminal of the fifth transistor T5. Meanwhile, the first power supply line VDL also overlaps with the second electrode plate C2 of the storage capacitor C and they are connected through the via hole, so that the first power supply line VDL can be connected to the second electrode plate C2 of the storage capacitor C.

As shown in FIG. 11, the wiring layer SD further includes a first adapter part CLB1 and a second adapter part CLB2. The first adapter part CLB1 may be connected to the first electrode plate C1 and a part where the second semiconductor layer SE2 overlaps with the first scan line GAL1 through via holes, respectively, and the first via hole connecting the first adapter part CLB1 and the first electrode plate C1 passes through the second electrode plate C2 and is insulated from the second electrode plate C2. For example, the second electrode plate C2 may be provided with at least one through hole CH2, and the first via hole connecting the first adapter part CLB1 and the first electrode plate C1 may pass through the through hole CH2, and the through hole CH2 surrounds outside the via hole. Thus, the eighth transistor T8 can be connected to the gate of the third transistor T3 and the first electrode plate C1.

The second adapter part CLB2 may connect one end of the second semiconductor layer SE2 located on the second scanning line G2 away from the first scanning line G1, and a part of the second active part SEP2 located on the second scanning line GAL2 away from the first scanning line GAL1, through a second via hole respectively, to connect the first terminal of the eighth transistor T8 with the second terminal of the first transistor T1 and the second terminal of the second transistor T2.

Optionally, the orthographic projection of the first power supply line VDL on the substrate SU does not overlap with the orthographic projection of at least one of the first adapter part CLB1, the second adapter part CLB2 and the through hole CH2 on the substrate SU. Optionally, the orthographic projection of the first power supply line VDL on the substrate SU does not overlap with the orthographic projection of any of the first adapter part CLB1, the second adapter part CLB2 and the through hole CH2 on the substrate SU.

Optionally, the orthographic projection of the first power supply line VDL on the substrate SU does not overlap with the orthographic projection of the first via hole connecting the first adapter part CLB1 and the first electrode plate C1 on the substrate SU; and/or, the orthographic projection of the first power supply line VDL on the substrate SU does not overlap with the orthographic projection of the second via hole connecting the second adapter part CLB2 and the second semiconductor layer SE2 on the substrate SU.

Further, in some embodiments of the present disclosure, as shown in FIGS. 2 and 5, the second gate layer GA2 further includes an auxiliary scan line GALs, which may extend in the row direction and overlap with the second semiconductor layer SE2, and may also serve as the gate of the eighth transistor T8. Also, the auxiliary scan line GALs may overlap with the second scan line GAL2 and connected thereto, thereby increasing the area of the gate of the eighth transistor T8. For example, the auxiliary scan line GALs and its overlapping second scan line GAL2 may extend to the peripheral area and be connected by the via hole in the peripheral area.

Further, in the column direction, the auxiliary scan line GALs and its overlapping second scan line GAL2 partially overlap. Specifically, a boundary of the orthographic projection of the auxiliary scan line GALs on the substrate SU is located within the orthographic projection of the second scan line GAL2 on the substrate, and the other boundary of the orthographic projection of the auxiliary scan line GALs on the substrate SU is located outside the orthographic projection of the second scan line GAL2 on the substrate SU. The second scan line GAL2 can also be located in the first gate layer GA1.

Correspondingly, the region of the auxiliary scan line GALs that overlaps with the channel region of the active layer of the eighth transistor T8 may serve as an auxiliary gate close to the eighth transistor T8.

In some embodiments of the present disclosure, as shown in FIGS. 2 and 5, the second gate layer GA2 may include an auxiliary power supply line VDLs, which may be connected to the first power supply line VDL, thereby increasing the area of the first power supply line VDL and reducing the resistance. By way of example, the auxiliary power supply line VDLs may be of an integral structure with the second electrode plate C2, and extend in the row direction, and the first power supply line VDL is connected to the second electrode plate C2 through a via hole, thereby connecting the auxiliary power supply line VDLs to the first power supply line VDL. Besides, since the first power supply line VDL extends in the column direction and the auxiliary power supply line VDLs extends in the row direction, a three-dimensional mesh power supply line may be formed.

The light-shielding layer BSM may at least overlap with the channel region of the active layer of the third transistor T3, and the material of the light-shielding layer BSM may be a metal or other light-shielding material, so as to at least shield the third transistor T3 from light and keep the electrical characteristics of the third transistor T3 stable. By way of example, the light-shielding layer BSM may include a plurality of light-shielding blocks BSMp. The light-shielding blocks BSMp overlap with the channel region of the active layer of the third transistor T3, and may shield light for the third transistor T3. The orthographic projection of the channel region on the substrate SU is located within the overlapping light-shielding blocks BSMp. Meanwhile, the light-shielding layer BSM may be made of conductive material such as metal, and the light-shielding layer BSM may also include a plurality of connection lines BSMl. Two adjacent light-shielding blocks BSMp are connected through the connection line BSMI, so that the light-shielding layer BSM is a mesh structure, and thus may play a shielding role.

Optionally, corresponding to at least one pixel circuit, the projection area of the light-shielding block BSMp on the substrate is larger than the orthographic projection area of the first electrode plate C1 of the storage capacitor C on the substrate.

Optionally, corresponding to at least one pixel circuit, the light-shielding block BSMp is electrically connected to the second electrode plate C2 of the storage capacitor C, so that the storage capacitance of the storage capacitor C of the corresponding pixel can be increased.

Optionally, BSMps corresponding to two adjacent pixel circuits are mirror symmetrical, so that the light-shielding effect of adjacent sub-pixel circuits can be the same. Alternatively, the BSMps corresponding to sub-pixels of the same color (e.g., red sub-pixels) are mirror symmetrical, so that the light-shielding effect of the same color sub-pixel circuit is the same. It is also possible that BSMps corresponding to two rows of pixel circuits or two columns of pixel circuits are mirror symmetrical.

The above description of transistors and wirings is based on one pixel circuit and its connected wirings. In some embodiments of the present disclosure, as for a plurality of pixel circuits distributed in an array, the shielding relationship of the first electrode and its connected pixel circuit is described below.

Figure 12:
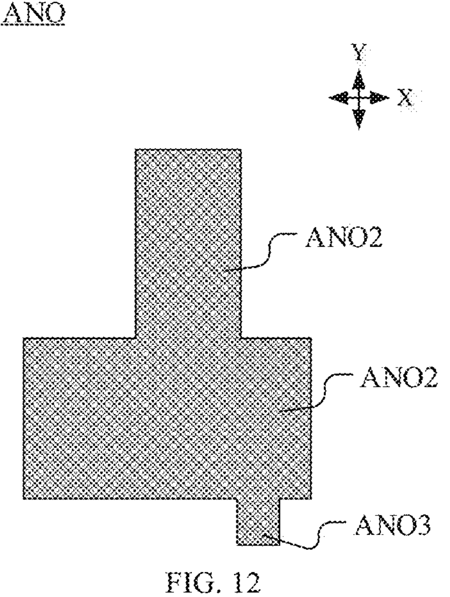

As shown in FIG. 2 and FIG. 12, at least one first electrode ANO overlaps with the active layer of one second type of transistor, thereby shielding the second type of transistor by the first electrode ANO, and keeping its electrical characteristics stable. By way of example, in order to improve the light shielding effect, an orthographic projection of the channel region of the active layer of the eighth transistor T8 on the substrate SU can be entirely located within the orthographic projection of the first electrode ANO on the substrate SU, to shield light for the eighth transistor T8 to the maximum extent.

In some embodiments of the present disclosure, as shown in FIG. 2 and FIG. 12, the first electrode ANO may include an electrode part ANOP1, a shielding part ANOP2, and a connecting part ANOP3. The shielding part ANOP2 and the connecting part ANOP3 extend outward from an edge of the electrode part ANOP, and the above three may be of an integral structure. The light emitting material layer EL may be provided on the surface of the electrode part ANOP1 away from the substrate SU. The opening of the pixel definition layer PDL exposes a part of the electrode part ANOP1, while the shielding part ANOP2 and the connecting part ANOP3 are covered by the pixel definition layer PDL.

In a pixel circuit and its corresponding first electrode ANO, the active layer of the eighth transistor T8 overlaps with the shielding part ANOP2. For example, the shielding part ANOP2 may extend in the column direction to overlap with the first reset control line REL1. The boundary of the orthographic projection of the shielding part ANOP2 on the substrate SU surrounds outside the orthographic projection of the channel region of the active layer of the eighth transistor T8 on the substrate SU. The connecting part ANOP3 is connected to the second terminal of the sixth transistor T6. In other words, the first electrode ANO is light shielded and connected using a part other than its electrode part ANOP1. To ensure the light shielding effect, the orthographic projection of the channel region of the eighth transistor T8 on the substrate SU can be located within the orthographic projection of the shielding part ANOP2.

At least part of the area of the electrode part ANOP1 is located between the first active part SEP1 and the second active part SEP2, and both the first scan line GAL1 and the second scan line GAL2 overlap with the shielding part ANOP2. The connecting part ANOP3 is located on the side of the electrode part ANOP1 away from the shielding part ANOP2, and overlaps with the light emitting control line EML.

The first adapter part CLB1 overlaps with the shielding part ANOP2, and both the electrode part ANOP1 and the shielding part ANOP2 overlap with the second adapter part CLB2.

Both the data line DAL and the first power supply line VDL overlap with the electrode part ANOP1 of the first electrode ANO.

In other embodiments of the present disclosure, the first electrode ANO may also be not provided with the shielding part ANOP2, but only include the electrode part ANOP1 and the connecting part ANOP3, and use the electrode part ANOP1 to shield the channel region of the second type of transistor (e.g., the eighth transistor T8).

It should be noted that, in some embodiments of the present disclosure, the first electrode ANO including the shielding part ANOP2 and the first electrode ANO not including the shielding part ANOP2 may be present simultaneously.

As for a pixel circuit and its connected first electrode ANO, the first electrode ANO can shield the channel region of the second type of transistor (e.g., eighth transistor T8) of other pixel circuits, and the second type of transistor of this pixel circuit can be shielded by the connected other first electrodes ANO. The first electrode ANO can shield the second type of transistor of the pixel circuit to which it is connected, and the distribution of the first electrodes ANO is not limited herein.

This implementation of the present disclosure provides a method of manufacturing a display panel, which may be a display panel of any of the above-mentioned implementations. Accordingly, the manufacturing method includes:

forming a transistor layer having a plurality of pixel circuits on a side of a substrate, the pixel circuits including a storage capacitor and a plurality of transistors, the transistors including a first type of transistor and a second type of transistor, material of an active layer of the first type of transistor including silicon, and material of an active layer of the second type of transistor including a metal oxide;

forming a wiring layer on a side of the transistor layer away from the substrate, wherein the wiring layer includes a first power supply line and a data line connected to the pixel circuits;

forming a flat layer covering the wiring layer;

forming a light emitting layer including a plurality of light emitting devices on a surface of the flat layer away from the wiring layer, the light emitting devices including first electrodes, light emitting material layers and second electrodes laminated in a direction away from the substrate, one of the first electrodes being connected to one of the pixel circuits; the first electrode being a light-shielding structure, and at least one of the first electrodes overlapping with an active layer of one of the second type of transistor.

The details of the structure involved in the above manufacturing method have been described above in the implementation of the display panel, and specific reference can be made to the implementation and beneficial effects of the display panel, which will not be repeated herein.

It should be noted that although the individual steps of the manufacturing method in the present disclosure are described in the accompanying drawings in a particular order, it is not required or implied that the steps must be performed in that particular order or that all of the steps shown must be performed to achieve the desired results. Additional or alternatively, certain steps may be omitted, multiple steps may be combined into one step for execution, and/or one step may be broken down into multiple steps for execution, etc.

The present disclosure also provides a display apparatus, which may include a display panel of any of the above embodiments, the specific structure and beneficial effects of which may be referred to the above embodiments of the display panel and will not be repeated herein. The display apparatus of the present disclosure can be a smart watch, a bracelet, and can also be used for cell phones, tablet computers and other electronic devices with display functions, which will not be enumerated herein.

Other embodiments of the present disclosure will readily come to the mind of those skilled in the art after considering the specification and practicing the disclosure disclosed herein. This application is intended to cover any variations, uses, or adaptations of the present disclosure that follow the general principles of the present disclosure and include commonly known or customary technical means in the art that are not disclosed herein. The specification and embodiments are to be considered exemplary only, and the true scope and spirit of the present disclosure is indicated by the appended claims.

What is claimed is:

1. A display panel, comprising: a substrate; a transistor layer, disposed on a side of the substrate and comprising a storage capacitor and a plurality of transistors, the transistors comprising a first type of transistor and a second type of transistor, material of an active layer of the first type of transistor comprising silicon, and material of an active layer of the second type of transistor comprising a metal oxide based semiconductor; a wiring layer, disposed on a side of the transistor layer away from the substrate and connected to the transistor layer to form a plurality of pixel circuits, wherein the wiring layer comprises a first power supply line and a data line connected to the pixel circuits, and an orthographic projection of the first power supply line on the substrate does not overlap with an orthographic projection of the second type of transistor on the substrate; a flat layer, covering the wiring layer; a light emitting layer, disposed on a surface of the flat layer away from the wiring layer and comprising a plurality of light emitting devices, the light emitting devices comprising first electrodes, light emitting material layers and second electrodes, one of the first electrodes being connected to one of the pixel circuits; the first electrode being a light-shielding structure, and at least one of the first electrodes overlapping with an active layer of one of the second type of transistor.

2. The display panel according to claim 1, wherein the first electrode is provided in one-to-one correspondence with the pixel circuit in a direction perpendicular to the substrate, and any of the first electrodes overlaps with the active layer of the second type of transistor of the corresponding pixel circuit; the wiring layer is in direct contact with the flat layer, and the first electrode is in direct contact with the flat layer.

3. The display panel according to claim 1, wherein the transistors of the pixel circuit comprise first to seventh transistors belonging to the first type of transistor and an eighth transistor belonging to the second type of transistor; the transistor layer comprising a first reset control line, a second reset control line, a first reset data line, a second reset data line, a first scan line, a second scan line and a light emitting control line;

- a first terminal of the first transistor is connected to the first reset data line, a second terminal of the first transistor is connected to a second terminal of the second transistor and a first terminal of the eighth transistor, a gate of the first transistor is connected to the first reset control line;
- a first terminal of the second transistor is connected to a second terminal of the third transistor and a first terminal of the sixth transistor, a gate of the second transistor is connected to the first scan line;
- a first terminal of the third transistor is connected to a second terminal of the fourth transistor and a second terminal of the fifth transistor;
- a gate of the fourth transistor is connected to the first scan line; a first terminal of the fourth transistor is connected to the data line;
- a gate of the fifth transistor and a gate of the sixth transistor are connected to the light emitting control line; a first terminal of the fifth transistor is connected to the first power supply line;
- a second terminal of the sixth transistor and a second terminal of the seventh transistor are connected to the first electrode;
- a gate of the seventh transistor is connected to the second reset control line;
- a first electrode plate of the storage capacitor and a gate of the third transistor are connected to the second terminal of the second transistor, and a second electrode plate of the storage capacitor is connected to the first power supply line;
- a gate of the eighth transistor is connected to the second scan line and a second terminal of the eighth transistor is connected to the gate of the third transistor.

4. The display panel according to claim 3, wherein the transistor layer comprises:

- a first semiconductor layer, disposed on a side of the substrate and comprising an active layer of the first to seventh transistors;
- a first gate insulating layer, covering the first semiconductor layer;
- a first gate layer, disposed on a surface of the first gate insulating layer away from the substrate and comprising the first reset control line, the first scan line, the light emitting control line and the first electrode plate;
- a second gate insulating layer, covering the first gate layer;
- a second gate layer, disposed on a surface of the second gate insulating layer away from the substrate and comprising the first reset data line, the second reset data line and the second electrode plate;
- a first isolation layer, covering the second gate layer;
- a second semiconductor layer, disposed on a surface of the first isolation layer away from the substrate, and comprising an active layer of the eighth transistor;
- a third gate insulating layer, covering the second semiconductor layer;
- a third gate layer, disposed on a surface of the third gate insulating layer away from the substrate, and comprising the second scan line;
- a second isolation layer, covering the third gate layer; the wiring layer disposed on a surface of the second isolation layer away from the substrate.

5. The display panel according to claim 4, wherein the first electrode comprises an electrode part and a connecting part and a shielding part extending outward from an edge of the electrode part;

the light emitting material layer is disposed on a surface of the electrode part away from the substrate;

in one of the pixel circuits and its corresponding first electrode, the active layer of the eighth transistor overlaps with the shielding part, and the connecting part is connected to the second terminal of the sixth transistor.

6. The display panel according to claim 5, wherein the first scan line, the second scan line and the light emitting control line all extend in a row direction and are distributed at intervals along a column direction, the first scan line is located between the light emitting control line and the second scan line;

the first electrode plate and the second electrode plate are located between the first scan line and the light emitting control line;

the second semiconductor layer extends along the column direction and overlaps with the second scan line to constitute the eighth transistor;

the first semiconductor layer comprises a first active part, a second active part and a third active part distributed along the row direction; the first active part and the second active part both extend along the column direction and are distributed along the row direction, the third active part is connected between the first active part and the second active part; the first scan line overlaps with the first active part to constitute the fourth transistor; the first scan line overlaps with the second active part to constitute the second transistor; the light emitting control line overlaps with the first active part to constitute the fifth transistor; the light emitting control line overlaps with the second active part to constitute the sixth transistor; and the first electrode plate overlaps with the third active part to constitute the third transistor;

in one of the first electrodes and a pixel circuit connected thereto, at least a part region of the electrode part is located between the first active part and the second active part, both the first scan line and the second scan line overlap with the shielding part; the connecting part is located on a side of the electrode part away from the shielding part and overlaps with the light emitting control line.

7. The display panel according to claim 6, wherein both the data line and the first power supply line overlap with the first electrode and are located between the first active part and the second active part, the first power supply line is located between the data line and the second active part;

the first active part has a first end extending to a side of the first scan line away from the light emitting control line and has a first contact part extending toward the second active part; the first active part has a second end extending to a side of the light emitting control line away from the first scan line and has a second contact part extending toward the second active part;

both the first contact part and the second contact part overlap with the data line, and the data line is connected to the first contact part; the first power supply line overlaps with and is connected to the second contact part.

8. The display panel according to claim 6, wherein the first reset control line is located on a side of the second scan line away from the first scan line and extends along the row direction;

the second semiconductor layer has a first end extending to a side of the second scan line away from the first scan line, and has a second end overlapping with the first scan line; the second active part extends to the side of the second scan line away from the first scan line and overlaps with the first reset control line to constitute the first transistor;

the wiring layer further comprises a first adapter part and a second adapter part, the first adapter part extends along the column direction and is located between the first power supply line and the second active part, the first adapter part is connected to the first electrode plate and a part where the second semiconductor layer overlaps with the first scan line;

the second adapter part extends along the row direction and is located on a side of the second scan line away from the first scan line, the second adapter part is connected to a part of the second semiconductor layer and the second active part located on the second scan line away from the first scan line;

the first adapter part overlaps with the shielding part, both the electrode part and the shielding part overlap with the second adapter part.

9. The display panel according to claim 8, wherein the second electrode plate of the storage capacitor is provided with at least one through hole; the first power supply line extends along the column direction, an orthographic projection of the first power supply line on the substrate does not overlap with an orthographic projection of at least one of the first adapter part, the second adapter part and the through hole of the second electrode plate on the substrate.

10. The display panel according to claim 4, wherein the second gate layer further comprises an auxiliary scan line, the auxiliary scan line extends along a row direction, and the auxiliary scan line overlaps with and is connected to the second scan line;

in the column direction, a boundary of an orthographic projection of the auxiliary scan line on the substrate is located within an orthographic projection of the second scan line on the substrate, and another boundary of the orthographic projection of the auxiliary scan line on the substrate is located outside the orthographic projection of the second scan line on the substrate.

11. The display panel according to claim 4, wherein the second gate layer comprises an auxiliary power supply line, the auxiliary power supply line is connected to the first power supply line.

12. The display panel according to claim 11, wherein the auxiliary power supply line is in an integral structure with the second electrode plate and extends along a row direction; the first power supply line is connected to the second electrode plate.

13. A method of manufacturing a display panel, comprising: forming a transistor layer having a plurality of pixel circuits on a side of a substrate, the pixel circuits comprising a storage capacitor and a plurality of transistors, the transistors comprising a first type of transistor and a second type of transistor, material of an active layer of the first type of transistor comprising silicon, and material of an active layer of the second type of transistor comprising a metal oxide based semiconductor; forming a wiring layer on a side of the transistor layer away from the substrate, wherein the wiring layer comprises a first power supply line and a data line connected to the pixel circuits; forming a flat layer covering the wiring layer; forming a light emitting layer comprising a plurality of light emitting devices on a surface of the flat layer away from the wiring layer, the light emitting devices comprising first electrodes, light emitting material layers and second electrodes laminated in a direction away from the substrate, one of the first electrodes being connected to one of the pixel circuits; the first electrode being a light-shielding structure, and at least one of the first electrodes overlapping with an active layer of one of the second type of transistor.

14. A display apparatus, comprising a display panel, wherein the display panel comprises: a substrate; a transistor layer, disposed on a side of the substrate and comprising a storage capacitor and a plurality of transistors, the transistors comprising a first type of transistor and a second type of transistor, material of an active layer of the first type of transistor comprising silicon, and material of an active layer of the second type of transistor comprising a metal oxide based semiconductor; a wiring layer, disposed on a side of the transistor layer away from the substrate and connected to the transistor layer to form a plurality of pixel circuits, wherein the wiring layer comprises a first power supply line and a data line connected to the pixel circuits, and an orthographic projection of the first power supply line on the substrate does not overlap with an orthographic projection of the second type of transistor on the substrate; a flat layer, covering the wiring layer; a light emitting layer, disposed on a surface of the flat layer away from the wiring layer and comprising a plurality of light emitting devices, the light emitting devices comprising first electrodes, light emitting material layers and second electrodes, one of the first electrodes being connected to one of the pixel circuits; the first electrode being a light-shielding structure, and at least one of the first electrodes overlapping with an active layer of one of the second type of transistor.

15. The apparatus according to claim 14, wherein the first electrode is provided in one-to-one correspondence with the pixel circuit in a direction perpendicular to the substrate, and any of the first electrodes overlaps with the active layer of the second type of transistor of the corresponding pixel circuit; the wiring layer is in direct contact with the flat layer, and the first electrode is in direct contact with the flat layer.

16. The apparatus according to claim 14, wherein the transistors of the pixel circuit comprise first to seventh transistors belonging to the first type of transistor and an eighth transistor belonging to the second type of transistor; the transistor layer comprising a first reset control line, a second reset control line, a first reset data line, a second reset data line, a first scan line, a second scan line and a light emitting control line;

- a first terminal of the first transistor is connected to the first reset data line, a second terminal of the first transistor is connected to a second terminal of the second transistor and a first terminal of the eighth transistor, a gate of the first transistor is connected to the first reset control line;
- a first terminal of the second transistor is connected to a second terminal of the third transistor and a first terminal of the sixth transistor, a gate of the second transistor is connected to the first scan line;
- a first terminal of the third transistor is connected to a second terminal of the fourth transistor and a second terminal of the fifth transistor;
- a gate of the fourth transistor is connected to the first scan line; a first terminal of the fourth transistor is connected to the data line;
- a gate of the fifth transistor and a gate of the sixth transistor are connected to the light emitting control line; a first terminal of the fifth transistor is connected to the first power supply line;
- a second terminal of the sixth transistor and a second terminal of the seventh transistor are connected to the first electrode;
- a gate of the seventh transistor is connected to the second reset control line;
- a first electrode plate of the storage capacitor and a gate of the third transistor are connected to the second terminal of the second transistor, and a second electrode plate of the storage capacitor is connected to the first power supply line;
- a gate of the eighth transistor is connected to the second scan line and a second terminal of the eighth transistor is connected to the gate of the third transistor.

17. The apparatus according to claim 16, wherein the transistor layer comprises:

- a first semiconductor layer, disposed on a side of the substrate and comprising an active layer of the first to seventh transistors;
- a first gate insulating layer, covering the first semiconductor layer;
- a first gate layer, disposed on a surface of the first gate insulating layer away from the substrate and comprising the first reset control line, the first scan line, the light emitting control line and the first electrode plate;
- a second gate insulating layer, covering the first gate layer;
- a second gate layer, disposed on a surface of the second gate insulating layer away from the substrate and comprising the first reset data line, the second reset data line and the second electrode plate;
- a first isolation layer, covering the second gate layer;
- a second semiconductor layer, disposed on a surface of the first isolation layer away from the substrate, and comprising an active layer of the eighth transistor;
- a third gate insulating layer, covering the second semiconductor layer;
- a third gate layer, disposed on a surface of the third gate insulating layer away from the substrate, and comprising the second scan line;
- a second isolation layer, covering the third gate layer; the wiring layer disposed on a surface of the second isolation layer away from the substrate.

18. The apparatus according to claim 17, wherein the first electrode comprises an electrode part and a connecting part and a shielding part extending outward from an edge of the electrode part;

- the light emitting material layer is disposed on a surface of the electrode part away from the substrate;
- in one of the pixel circuits and its corresponding first electrode, the active layer of the eighth transistor overlaps with the shielding part, and the connecting part is connected to the second terminal of the sixth transistor.

19. The apparatus according to claim 18, wherein the first scan line, the second scan line and the light emitting control line all extend in a row direction and are distributed at intervals along a column direction, the first scan line is located between the light emitting control line and the second scan line;

- the first electrode plate and the second electrode plate are located between the first scan line and the light emitting control line;
- the second semiconductor layer extends along the column direction and overlaps with the second scan line to constitute the eighth transistor;
- the first semiconductor layer comprises a first active part, a second active part and a third active part distributed along the row direction; the first active part and the second active part both extend along the column direction and are distributed along the row direction, the third active part is connected between the first active part and the second active part; the first scan line overlaps with the first active part to constitute the fourth transistor; the first scan line overlaps with the second active part to constitute the second transistor; the light emitting control line overlaps with the first active part to constitute the fifth transistor; the light emitting control line overlaps with the second active part to constitute the sixth transistor; and the first electrode plate overlaps with the third active part to constitute the third transistor;

in one of the first electrodes and a pixel circuit connected thereto, at least a part region of the electrode part is located between the first active part and the second active part, both the first scan line and the second scan line overlap with the shielding part; the connecting part is located on a side of the electrode part away from the shielding part and overlaps with the light emitting control line.

20. The apparatus according to claim 19, wherein both the data line and the first power supply line overlap with the first electrode and are located between the first active part and the second active part, the first power supply line is located between the data line and the second active part;

the first active part has a first end extending to a side of the first scan line away from the light emitting control line and has a first contact part extending toward the second active part; the first active part has a second end extending to a side of the light emitting control line away from the first scan line and has a second contact part extending toward the second active part;

both the first contact part and the second contact part overlap with the data line, and the data line is connected to the first contact part; the first power supply line overlaps with and is connected to the second contact part.

* * * * *